(12) United States Patent
Liao

(10) Patent No.: US 12,532,435 B2
(45) Date of Patent: *Jan. 20, 2026

(54) DRAWER-TYPE ELECTRONICS CABINET HAVING CIRCUIT CONTROLLING DEVICE

(71) Applicant: BLUESKY COOKING STYLE CO., LTD., Taipei (TW)

(72) Inventor: Chin-Jung Liao, Taipei (TW)

(73) Assignee: BLUESKY COOKING STYLE CO., LTD., Taipei (TW)

( * ) Notice: Subject to any disclaimer, the term of this patent is extended or adjusted under 35 U.S.C. 154(b) by 339 days.

This patent is subject to a terminal disclaimer.

(21) Appl. No.: 18/221,925

(22) Filed: Jul. 14, 2023

(65) Prior Publication Data

US 2024/0023286 A1 Jan. 18, 2024

(30) Foreign Application Priority Data

Jul. 15, 2022 (TW) ................................. 111126568

(51) Int. Cl.
*H05K 7/20* (2006.01)
*H05K 5/02* (2006.01)

(52) U.S. Cl.
CPC ....... *H05K 7/20572* (2013.01); *H05K 5/0217* (2013.01); *H05K 5/0247* (2013.01)

(58) Field of Classification Search
CPC ......... A47B 46/00; A47B 88/40; A47B 96/16; A47B 97/00; H05K 5/0217; H05K 5/0247; H05K 7/20572
USPC ...................................................... 312/402
See application file for complete search history.

(56) References Cited

U.S. PATENT DOCUMENTS

| 3,860,308 | A | * | 1/1975 | Burke | ................... | A47B 88/493 |
| | | | | | | 100/229 A |
| 5,242,220 | A | * | 9/1993 | Sandreth | ................. | B65F 1/004 |
| | | | | | | D34/1 |
| 8,783,800 | B2 | * | 7/2014 | Benigni | ................ | F25D 25/025 |
| | | | | | | 312/402 |
| 9,801,302 | B2 | * | 10/2017 | Huang | .................... | H05K 7/186 |
| 2003/0042828 | A1 | * | 3/2003 | Bonin | ..................... | A47B 67/02 |
| | | | | | | 220/87.1 |

(Continued)

FOREIGN PATENT DOCUMENTS

CN 216346498 U 4/2022

*Primary Examiner* — James O Hansen
(74) *Attorney, Agent, or Firm* — Li & Cai Intellectual Property (USA) Office

(57) ABSTRACT

A drawer-type electronics cabinet includes a cabinet body, two sliding rails, a carrying tray, a door plate, and a circuit controlling device. The circuit controlling device is disposed in the cabinet body and includes a controlling interface, a controller, a master switch circuit, a first switch circuit, and a second switch circuit. The controlling interface includes a master switch key, a first switch key, and a second switch key. The controller enters an operation or standby mode according to the master switch signal received by the controller. When the controller enters the standby mode, the master switch circuit is switched-off, and when the controller enters the operation mode, the master switch circuit is switched-on. When the controller enters the operation mode, the controller is used to respectively control the first and second switch circuits to be switched-on or switched-off according to the received first and second switch signals.

9 Claims, 7 Drawing Sheets

(56) References Cited

U.S. PATENT DOCUMENTS

| | | | | |
|---|---|---|---|---|
| 2012/0280602 | A1* | 11/2012 | Baker | A47B 67/04 |
| | | | | 312/236 |
| 2024/0022049 | A1* | 1/2024 | Liao | A61L 9/205 |
| 2024/0335034 | A1* | 10/2024 | Liao | A47B 77/08 |

* cited by examiner

DRAWER-TYPE ELECTRONICS CABINET HAVING CIRCUIT CONTROLLING DEVICE

CROSS-REFERENCE TO RELATED PATENT APPLICATION

This application claims the benefit of priority to Taiwan Patent Application No. 111126568, filed on Jul. 15, 2022. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to an electronics cabinet, and more particularly to a drawer-type electronics cabinet having a circuit controlling device.

BACKGROUND OF THE DISCLOSURE

As the main place for cooking in every household, the kitchen is where various electrical appliances such as electric pots, electric cookers, ovens, microwave ovens, and hot water bottles are located. However, without proper placement of these electrical appliances, the kitchen can quickly become disorganized.

Currently, an electronics cabinet is used for accommodating the abovementioned electrical appliances, and two sockets are disposed inside the electronics cabinet for two electrical appliances that are placed in the cabinet to provide electricity to the two electrical appliances. Locally, the most common electrical appliance that is placed in the cabinet is an electric rice cooker, which may be used for a long time and is present in almost every household. There is only one pop-up switch on the common electric rice cooker, and after pressing the switch, the electric rice cooker begins cooking. After the food is finished cooking, the pop-up switch will pop up so that the electric rice cooker starts keeping the food warm. This electric rice cooker is unable to be automatically switched-off, and continues warming the food and consuming electricity. When it is no longer necessary to warm the food, or when the electric rice cooker needs to be turned off, the only way is to manually unplug the plug. Therefore, for example, when two electronic appliances are placed in the electronics cabinet, e.g., a stewing pot and the electric rice cooker having only one pop-up switch, and the electric rice cooker finishes cooking, the pop-up switch of the electric rice cooker pops up so that the electric rice cooker starts to warm the food. At this time, the stewing pot still needs to perform cooking for a long period of time (e.g., 4 hours to 6 hours). Therefore, in order for the electric rice cooker to stop warming the food which consumes electricity, the user usually needs to put his hand into the electronics cabinet that is full of hot air to find the plug of the electric rice cooker and unplug the plug, which is quite inconvenient and dangerous. However, if the user switches off a power button on a socket panel of the electronics cabinet to avoid inconvenience and danger, the power will stop being supplied to both sockets in the electronics cabinet at the same time, causing the stewing pot to stop cooking suddenly and greatly inconveniencing the user. Since the common electric rice cooker with the single pop-up switch is very durable and easy to use, it is a difficult appliance to be replaced in the household, but since the electric rice cooker is commonly placed in the electronics cabinet to result in inconvenience and danger, there is still room for improvement on this long existing problem in the related art.

SUMMARY OF THE DISCLOSURE

In response to the above-referenced technical inadequacies, the present disclosure provides a drawer-type electronics cabinet having a circuit controlling device.

In order to solve the above-mentioned problems, one of the technical aspects adopted by the present disclosure is to provide a drawer-type electronics cabinet. The drawer-type electronics cabinet includes a cabinet body, two sliding rails, a carrying tray, a door plate, and a circuit controlling device. An accommodating space is formed inside the cabinet body, an opening is formed at a front side of the cabinet body, and the opening is in fluid communication with the accommodating space. A first socket and a second socket are disposed at a rear side of the cabinet body and are accessible from the accommodating space, respectively. The two sliding rails are oppositely disposed in the cabinet body, and the two sliding rails are located in the accommodating space and are adjacent to a bottom of the accommodating space. A left side and a right side of the carrying tray are respectively located on the two sliding rails, a front end portion and a rear end portion are respectively defined on a front end and a rear end of the carrying tray that are opposite to each other, and two side walls are respectively formed on the left side and the right side of the carrying tray that are opposite to each other. An upper end portion and a lower end portion are respectively defined at an upper end and a lower end of the door plate that are opposite to each other, and the lower end portion of the door plate is connected to the front end portion of the carrying tray, so that the carrying tray and the door plate are synchronously moved. The circuit controlling device is disposed in the cabinet body. The circuit controlling device includes a controlling interface, a controller, a master switch circuit, a first switch circuit, and a second switch circuit. The controller is electrically connected to the controlling interface, the master switch circuit, the first switch circuit, and the second switch circuit, the first switch circuit is electrically connected between the master switch circuit and the first socket, and the second switch circuit is electrically connected between the master switch circuit and the second socket. The controlling interface includes a master switch key, a first switch key, and a second switch key, the master switch key is used to generate a master switch signal that is transmitted to the controller, the first switch key is used to generate a first switch signal that is transmitted to the controller, and the second switch key is used to generate a second switch signal that is transmitted to the controller. The controller is used to enter an operation mode or a standby mode according to the master switch signal that is received by the controller. When the controller enters the standby mode, the master switch circuit is switched-off, and when the controller enters the operation mode, the master switch circuit is switched-on. When the controller enters the operation mode, the controller is used to respectively control the first switch circuit and the second switch circuit to be switched-on or switched-off according to the first switch signal and the second switch signal that are received by the controller.

In one of the possible or preferred embodiments, the first switch circuit includes a first left switch and a first right switch that are electrically connected to each other and are electrically connected to the controller, respectively, and the second switch circuit includes a second left switch and a second right switch that are electrically connected to each other and are electrically connected to the controller, respectively. The first left switch and the second left switch are semiconductor switches, and the first right switch and the second right switch are relay switches. When the controller switches the first switch circuit or the second switch circuit from being switched-on to being switched-off, the controller switches the first left switch or the second left switch to quickly be switched-off, and then switches the first right switch or the second right switch to be switched-off.

In one of the possible or preferred embodiments, the controller is further used to continuously record a manually switched-off frequency of the first switch circuit and the second switch circuit, so as to automatically switch off the first switch circuit or the second switch circuit according to a higher one of manually switched-off frequencies of the first switch circuit and the second switch circuit.

In one of the possible or preferred embodiments, the cabinet body includes at least one exhaust fan disposed inside the cabinet body, the circuit controlling device further includes an exhaust fan controlling circuit, and the exhaust fan controlling circuit is electrically connected between the controller and the exhaust fan.

In one of the possible or preferred embodiments, the cabinet body includes a negative ion cleaning device that is electrically connected to the controller and is disposed inside the cabinet body, and the negative ion cleaning device is configured to ionize air molecules when the first switch circuit and the second switch circuit are switched-off, so as to generate a large amount of negative ions and a trace amount of ozone.

In one of the possible or preferred embodiments, at least one reinforcement member is disposed between the door plate and the carrying tray, and the reinforcement member has a vertical reinforcement sheet and an extension reinforcement sheet that extends from one side of the vertical reinforcement sheet and is bent at ninety degrees. The vertical reinforcement sheet is fixed on a rear side of the door plate, and the extension reinforcement sheet is adjustably fixed on an inner wall surface of one of the two side walls of the carrying tray. The extension reinforcement sheet has a plurality of long adjustment holes formed thereon, and the plurality of long adjustment holes are arranged in a longitudinal direction of the one side wall of the carrying tray and in a front-and-rear arrangement relative to the door plate, so that the extension reinforcement sheet is adjustably fixed to the inner wall surface of the one side wall of the carrying tray in a front-and-rear arrangement relative to the door plate through the plurality of long adjustment holes and corresponding screws that pass through the plurality of long adjustment holes.

In one of the possible or preferred embodiments, the plurality of long adjustment holes are horizontal long adjustment holes having a longitudinal direction that is horizontal, and the long adjustment holes is adjustably movable along a longitudinal direction of the one side wall of the carrying tray.

In one of the possible or preferred embodiments, the extension reinforcement sheet has a connection segment perpendicular to the vertical reinforcement sheet and a horizontal extension segment that extends horizontally from the connection segment along the longitudinal direction of the one side wall of the carrying tray.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The described embodiments may be better understood by reference to the following description and the accompanying drawings, in which.

DETAILED DESCRIPTION OF THE EXEMPLARY EMBODIMENTS

Figure 1:
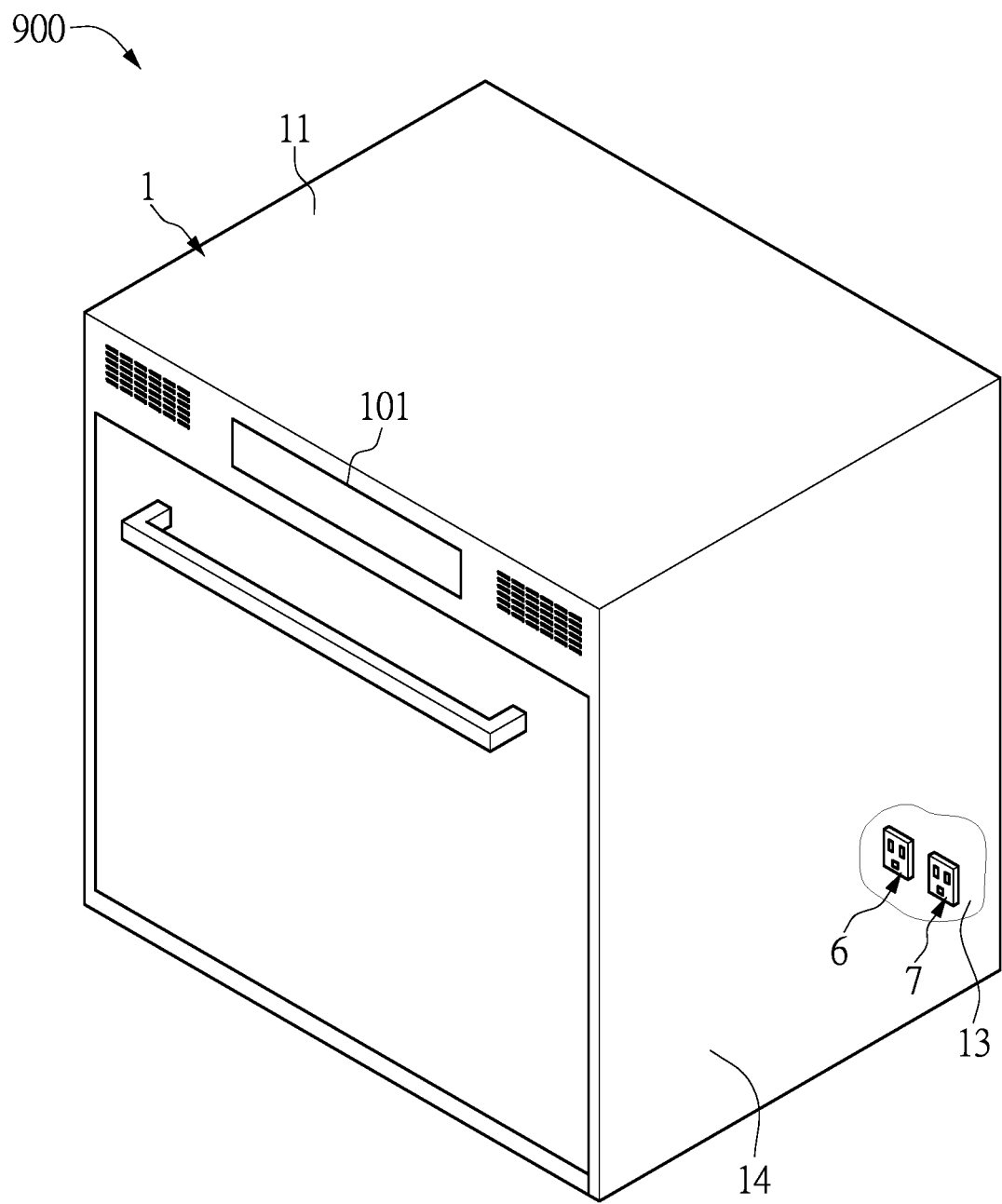
FIG. 1 is a schematic perspective view of a drawer-type electronics cabinet having a circuit controlling device of the present disclosure.
Figure 2:
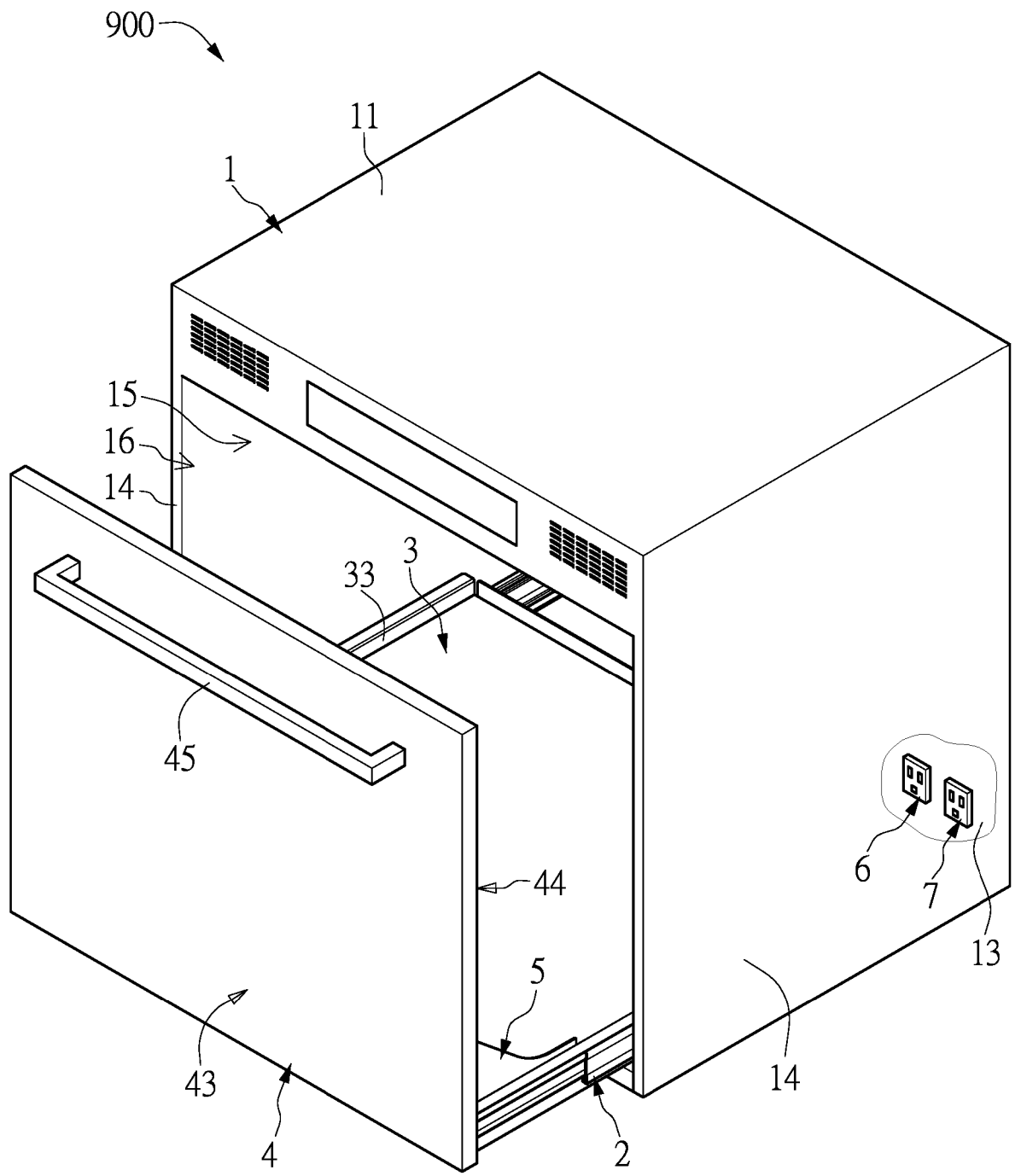
FIG. 2 is a schematic perspective view of a door plate of the drawer-type electronics cabinet having the circuit controlling device of the present disclosure being opened.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

Embodiment

Referring to FIG. 1 to FIG. 7, the present disclosure provides a drawer-type electronics cabinet 900 having a circuit controlling device 100. The drawer-type electronics cabinet 900 can be used to accommodate electronic appliances or other kitchen appliances, and the drawer-type electronics cabinet 900 can be mounted in base cabinets (i.e., cabinets that are below a kitchen counter), wall cabinets, or a kitchen island. The drawer-type electronics cabinet 900 includes a cabinet body 1, two sliding rails 2, a carrying tray 3, and a door plate 4.

The cabinet body 1 is preferably square-shaped. The cabinet body 1 includes a top plate 11, a bottom plate 12, a rear plate 13, and two side plates 14, and the top plate 11, the bottom plate 12, the rear plate 13, and the two side plates 14 are connected to each other to form a hollow cabinet body. Since a structure of the cabinet body 1 is a conventional technology and is not limited in the present disclosure, the conventional structure is not described in detail herein.

Accordingly, an accommodating space 15 is formed inside the cabinet body 1, that is, the accommodating space 15 is formed between the top plate 11, the bottom plate 12, the rear plate 13, and the two side plates 14. The accommodating space 15 can be used to accommodate electrical appliances such as electric pots, stewing pots, microwave ovens, and ovens. An opening 16 is formed at a front side of the cabinet body 1, and the opening 16 is in fluid communication with the accommodating space 15, so that electrical appliances can enter the accommodating space 15 through the opening 16.

The two sliding rails 2 are oppositely disposed in the cabinet body 1. The two sliding rails 2 can be disposed at two lateral sides of the cabinet body 1 and opposite to each other, that is, the two sliding rails 2 can be disposed on the two side plates 14, respectively. Furthermore, the two sliding rails 2 are located in the accommodating space 15 and are adjacent to a bottom of the accommodating space 15. The two sliding rails 2 can also be disposed on the bottom plate 12 of the cabinet body 1. Since a structure of the two sliding rails 2 is a conventional technology and is not limited in the present disclosure, the conventional structure is not described in detail herein.

A left side and a right side of the carrying tray 3 are respectively located on the two sliding rails 2, so that the carrying tray 3 is located adjacent to the bottom of the accommodating space 15. The carrying tray 3 can be substantially in a horizontal arrangement, and the carrying tray 3 can be pulled out from or pushed in relative to the cabinet body 1 through the guiding of the two sliding rails 2. Therefore, the carrying tray 3 can be horizontally moved (in a front-and-rear arrangement relative to the door plate 4) in the cabinet body 1, so that the carrying tray 3 can be pushed in the cabinet body 1 or pulled out of the cabinet body 1. When the carrying tray 3 is pushed in the cabinet body 1, the carrying tray 3 is located in the accommodating space 15.

In this embodiment, a front end portion 31 and a rear end portion 32 are respectively defined on a front end and a rear end of the carrying tray 3 that are opposite to each other, and two side walls 33 are respectively formed on the left side and the right side of the carrying tray 3 that are opposite to each other. One of the two sliding rails 2 can be disposed between an outer wall surface of one of the two side walls 33 and a corresponding one of the two side plates 14, and the other one of the two sliding rails 2 can be disposed between an outer wall surface of the other one of the two side walls 33 and another corresponding one of the two side plates 14.

The door plate 4 is a plate that corresponds to the opening 16 and can be used to open or close the opening 16. An upper end portion 41 and a lower end portion 42 are respectively defined at an upper end and a lower end of the door plate 4 that are opposite to each other, and a front surface 43 and a rear surface 44 are respectively defined at a front side and a rear side of the door plate 4 that are opposite to each other. The lower end portion 42 of the door plate 4 is connected to the front end portion 31 of the carrying tray 3, so that the carrying tray 3 and the door plate 4 are connected to each other, and the door plate 4 is connected to the carrying tray 3 in an upright position. Preferably, the door plate 4 and the carrying tray 3 are perpendicular to each other and can be synchronously moved. That is, the carrying tray 3 and the door plate can be synchronously moved along a horizontal direction. When the door plate 4 closes the opening 16, the carrying tray 3 is pushed into the cabinet body 1, and when the door plate 4 opens the opening 16, the carrying tray 3 is pulled out of the cabinet body 1. Furthermore, a handle 45 can be disposed on a position of a front surface 43 of the door plate 4 near the upper end portion 41, so that the door plate 4 can be pushed or pulled to open or close the opening 16 through the handle 45.

In this embodiment, two reinforcement members 5 are adjustably disposed between the door plate 4 and the carrying tray 3 in a laterally symmetrical manner. In detail, each of the two reinforcement members 5 has a vertical reinforcement sheet 51 and an extension reinforcement sheet 52 that extends from one side of the vertical reinforcement sheet 51 and is bent at ninety degrees. The vertical reinforcement sheet 51 is fixed on and abuts the rear surface 44 of the door plate 4, and the extension reinforcement sheet 52 is adjustably fixed on and abuts an inner wall surface of one of the two side walls 33 of the carrying tray 3. The extension reinforcement sheet 52 further has a plurality of long adjustment holes 520 formed thereon, and the plurality of long adjustment holes 520 are arranged in a longitudinal direction of the one side wall 33 of the carrying tray 3 and in a front-and-rear arrangement relative to the door plate 4, so that the extension reinforcement sheet 52 is adjustably fixed to the inner wall surface of the one side wall 33 of the carrying tray 3 in a front-and-rear arrangement relative to the door plate 4 through the plurality of long adjustment holes 520 and corresponding screws that pass through the plurality of long adjustment holes 520.

Furthermore, the plurality of long adjustment holes 520 are each a horizontal long adjustment hole having a longitudinal direction that is horizontal. That is, a length of each of the long adjustment holes 520 is horizontally extended along a horizontal direction. In other words, the long adjustment holes 520 horizontally extend along longitudinal direction of the side walls 33. An angle that is forward inclined or rearward inclined is naturally formed between the door plate 4 and the carrying tray 3 when a lower end portion 42 of the door plate 4 is connected to the front end portion 31 of the carrying tray 3. Therefore, the long adjustment holes 520 is adjustably movable along the longitudinal direction of the one side wall 33 of the carrying tray 3, so that the door panel 4 is moved and the angle that is forward inclined or rearward inclined between the door plate 4 and the carrying tray 3 can be adjusted. Moreover, in the present embodiment, the extension reinforcement sheet 52 has a connection segment 521 perpendicular to the vertical reinforcement sheet 51 and a horizontal extension segment 522 that extends horizontally from the connection segment 521 along the longitudinal direction of the one side wall 33 of the carrying tray 3. That is, in the present embodiment, the horizontal extension segment 522 horizontally extends along the longitudinal direction of the side wall 33 of the carrying tray 3, and a height of the horizontal extension segment 522 corresponds to a height of the side wall 33 of the carrying tray 3. In other words, the height of the horizontal extension segment 522 that horizontally extends can be the same as the height of the side wall 33 of the carrying tray 3, or marginally higher than the height of the side wall 33 of the carrying tray 3. Therefore, the horizontal extension segment 522 horizontally extends along the longitudinal direction of the side wall 33 of the carrying tray 3 to better support the vertical reinforcement sheet 51 and to avoid interfering with laterally placing electrical appliances into the drawer-type electronics cabinet 900.

Figure 3:
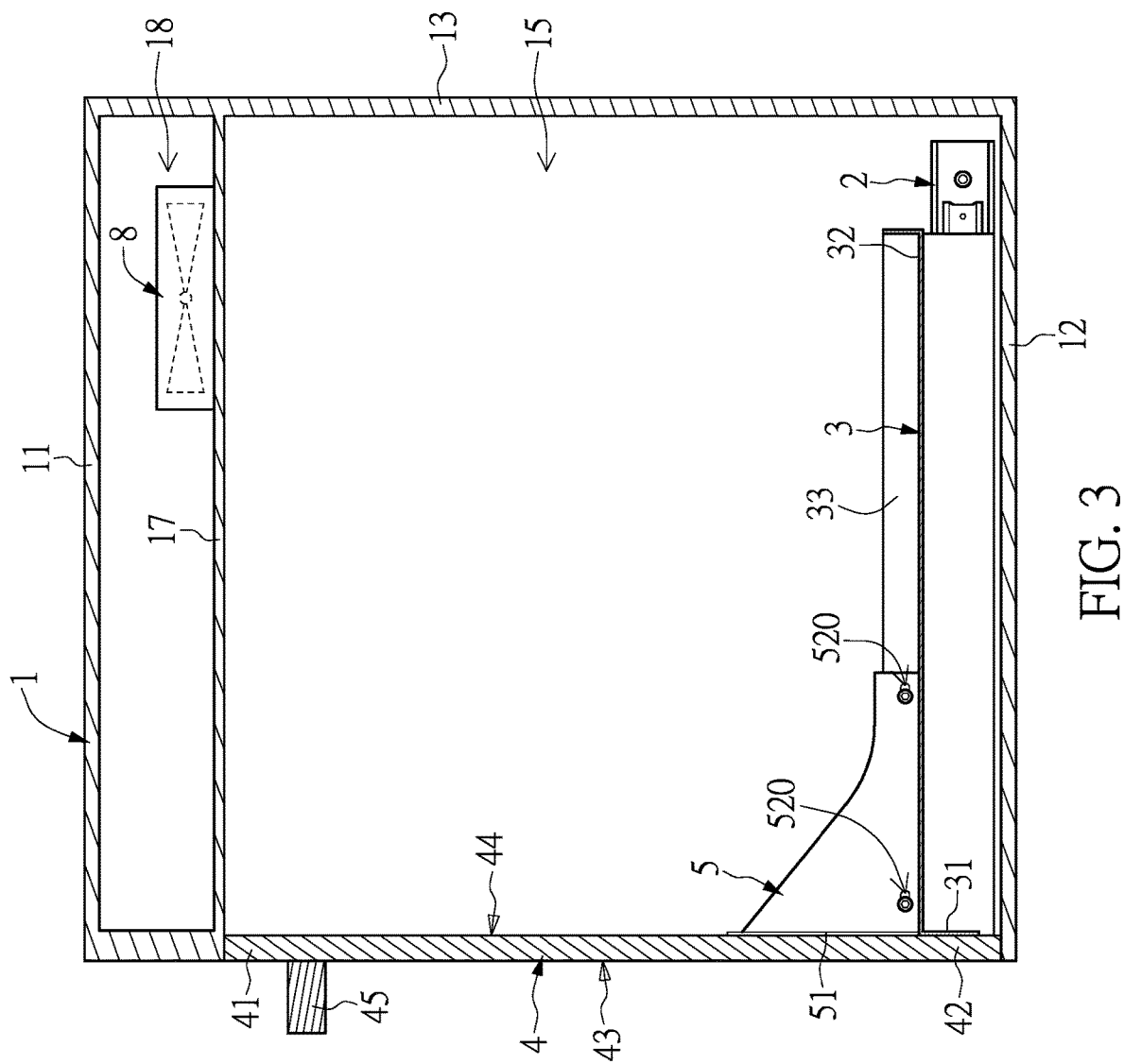
FIG. 3 is a schematic cross-sectional view of the drawer-type electronics cabinet having the circuit controlling device of the present disclosure.
Figure 4:
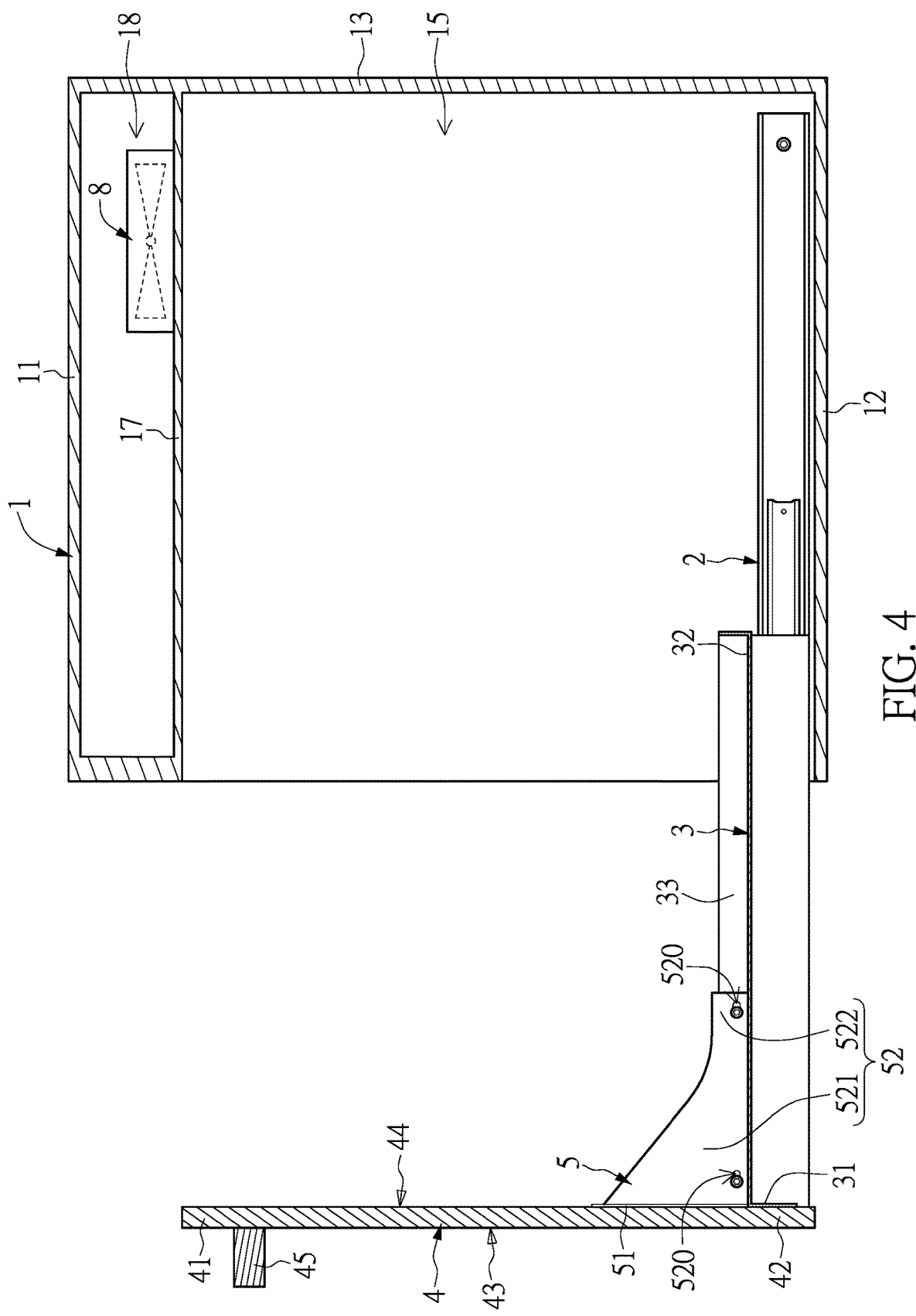
FIG. 4 is a schematic cross-sectional view of the door plate of the drawer-type electronics cabinet having the circuit controlling device of the present disclosure being opened.

In addition, a first socket 6 and a second socket 7 are disposed at a rear side of the cabinet body 1. That is, the first socket 6 and the second socket 7 can be disposed on the rear plate 13 of the cabinet body 1, and the first socket 6 and the second socket 7 are accessible from the accommodating space 15, respectively. Furthermore, as shown in FIG. 3, the cabinet body 1 can further include a dividing plate 17 to separate the accommodating space 15 from a mounting space 18, and at least one exhaust fan 8 can be located in the mounting space 18.

Figure 5:
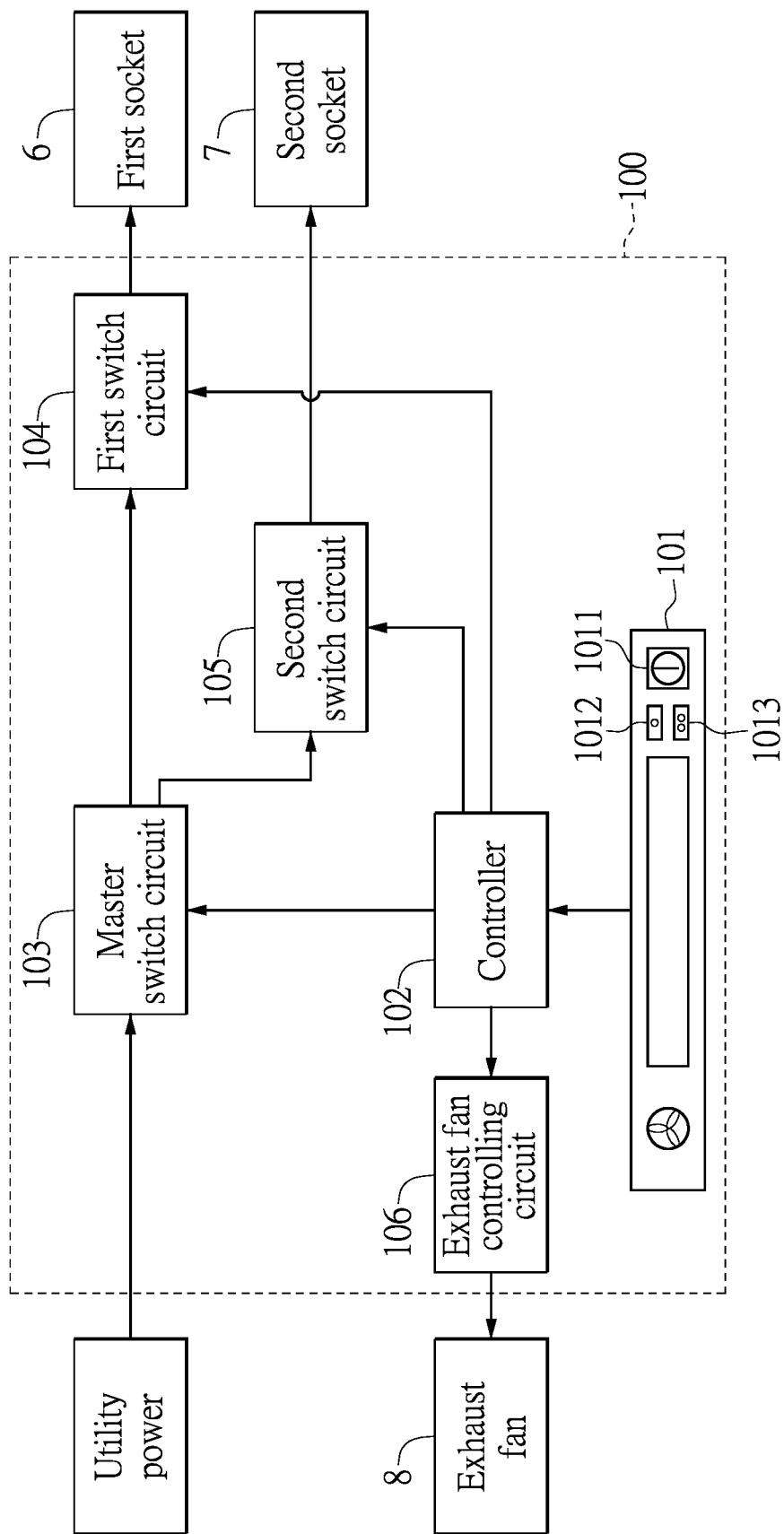
FIG. 5 is a schematic functional block diagram of the drawer-type electronics cabinet having the circuit controlling device of the present disclosure.

As shown in FIG. 5, the circuit controlling device 100 can be disposed on an appropriate location in the cabinet body 1. The circuit controlling device 100 includes a controlling interface 101, a controller 102, a master switch circuit 103, a first switch circuit 104, and a second switch circuit 105. The controller 102 is electrically connected to the controlling interface 101, the master switch circuit 103, the first switch circuit 104, and the second switch circuit 105. The first switch circuit 104 is electrically connected between the master switch circuit 103 and the first socket 6, and the second switch circuit 105 is electrically connected between the master switch circuit 103 and the second socket 7. In addition, the circuit controlling device 100 further includes an exhaust fan controlling circuit 106 that is such as a driving circuit or a pulse-width modulation (PWM) circuit, and the exhaust fan controlling circuit 106 is electrically connected between the controller 102 and the exhaust fan 8.

In this embodiment, the controlling interface 101 can be, but is not limited to being, exposed outside of the cabinet body 1 as a control panel. The controlling interface 101 is preferably exposed from the front side of the cabinet body 1. Furthermore, the controller 102, the master switch circuit 103, the first switch circuit 104, the second switch circuit 105, the exhaust fan controlling circuit 106, and relevant active and passive components can be integrated together to be a control substrate that is located in the mounting space 18. Furthermore, the controller 102 can also be integrated into the control panel that can be designed according to practical requirements, and the present disclosure is not intended to be limited thereto.

Furthermore, the controlling interface 101 can include a master switch key 1011, a first switch key 1012, and a second switch key 1013. The master switch key 1011, the first switch key 1012, and the second switch key 1013 can each be a pressing button or a touch-sensitive button, and the present disclosure is not intended to be limited thereto. The master switch key 1011 is used to generate a master switch signal that is transmitted to the controller 102 according to the pressing or touching of a user, the first switch key 1012 is used to generate a first switch signal that is transmitted to the controller 102 according to the pressing or touching of the user, and the second switch key 1013 is used to generate a second switch signal that is transmitted to the controller 102 according to the pressing or touching of the user.

Furthermore, the controller 102 is used to enter an operation mode or a standby mode according to the master switch signal that is received by the controller 102. When the user presses or touches the master switch key 1011 to generate the master switch signal that is transmitted to the controller 102, the controller 102 can enter the operation mode from the standby mode. When the user presses or touches the master switch key 1011 again to generate the master switch signal that is transmitted to the controller 102, the controller 102 can enter the standby mode from the operation mode. Furthermore, when the controller 102 enters the standby mode, the master switch circuit is switched-off, and when the controller 102 enters the operation mode, the master switch circuit is switched-on. When the controller 102 enters the operation mode, the controller 102 is used to respectively control the first switch circuit 104 and the second switch circuit 105 to be switched-on or switched-off according to the first switch signal and the second switch signal that are received by the controller 102. Therefore, for example, two electronic appliances are placed in the drawer-type electronics cabinet 900, e.g., a stewing pot and the electric rice cooker having only one pop-up switch. When the electric rice cooker finishes cooking, the pop-up switch of the electric rice cooker pops up so that the electric rice cooker starts warming food, at this time, the stewing pot still needs to perform cooking for a long period of time (e.g., from 4 hours to 6 hours). The user may press or touch the first switch key 1012 or the second switch key 1013 on the controlling interface 101 and corresponding to the electric rice cooker to switch off the first switch circuit 104 or the second switch circuit 105, so that the stewing pot continues operating and the electric rice cooker stops operating. In this way, when the user does not need the electric rice cooker to warm food, the user does not need to put his hand into the cabinet body 1 that is full of hot air to find the plug of the electric rice cooker and unplug the plug, thereby greatly improving convenience and safety in use.

In one embodiment, since two plugs of two electronic appliances inside of the drawer-type electronics cabinet 900 are plugged in the sockets for long durations (e.g., the plugs of the aforementioned stewing pot and the electric rice cooker are plugged on the first socket 6 and the second socket 7), the controller 102 is further used to continuously record a manually switched-off frequency of the first switch circuit 104 and the second switch circuit 105, so as to automatically switch off the first switch circuit 104 or the second switch circuit 105 according to a higher one of manually switched-off frequencies of the first switch circuit 104 and the second switch circuit 105.

Figure 6:
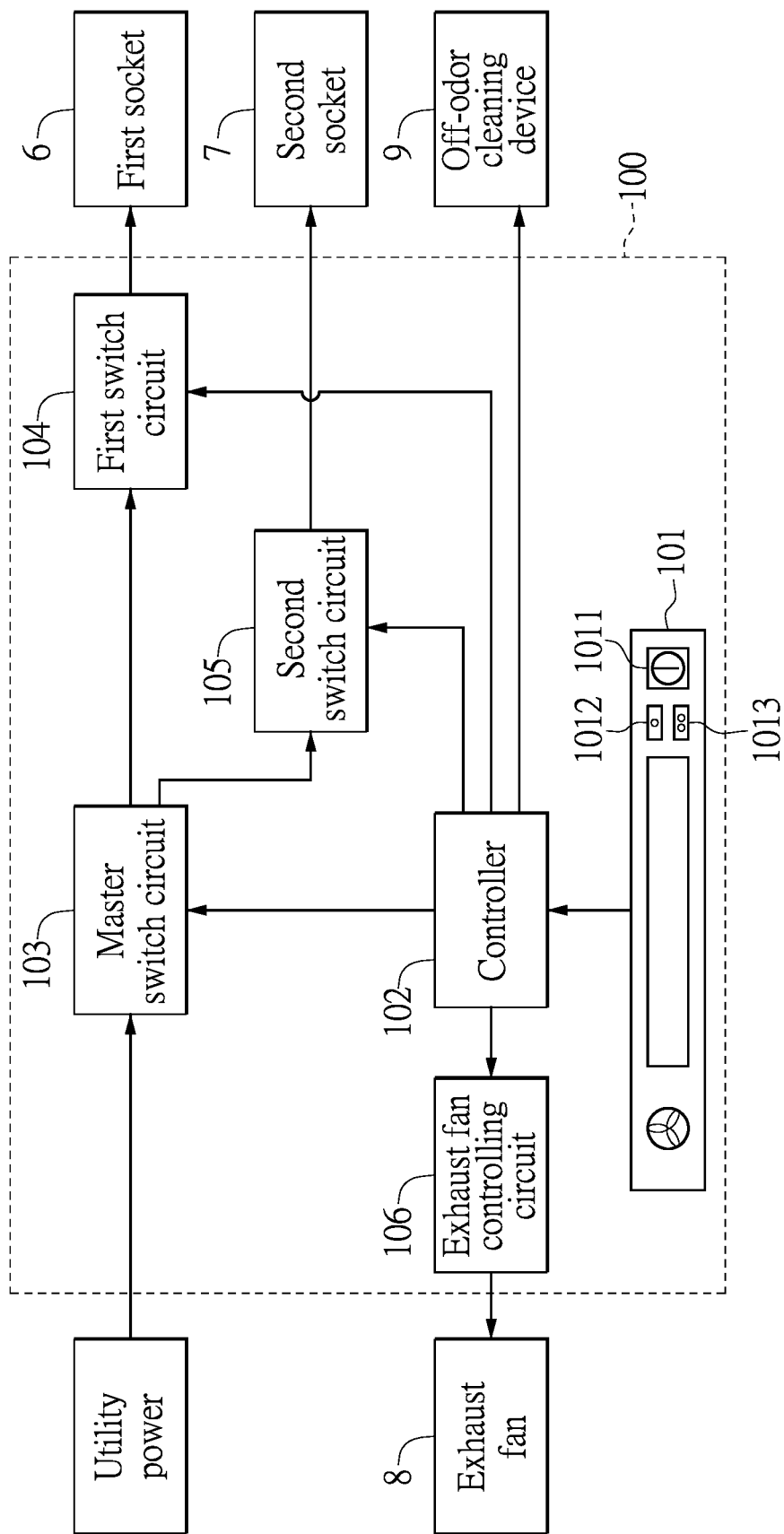
FIG. 6 is another schematic functional block diagram of the drawer-type electronics cabinet having the circuit controlling device of the present disclosure.

Reference can be made to FIG. 6, an off-odor cleaning device 9 that is electrically connected to the controller 102 can be disposed on appropriate locations inside the cabinet body 1, such as on the side plates 14 or the rear plate 13. The off-odor cleaning device 9 can be a negative ion cleaning device. When the first switch circuit 104 and the second switch circuit 105 are switched-off, that is, when the controller 102 receives the first switch signal and the second switch signal to switch off the first switch circuit 104 and the second switch circuit 105, the off-odor cleaning device 9 is configured to ionize air molecules, so as to generate a large amount of negative ions and a trace amount of ozone to neutralize an off-odor and extinguish bacteria. Therefore, the off-odor and the bacteria in the cabinet body 1 can be rapidly extinguished to ensure hygiene for future use. Furthermore, in the present disclosure, the off-odor cleaning device 9 can be a photocatalytic ultraviolet cleaning device. When the first switch circuit 104 and the second switch circuit 105 are switched-off, that is, when the controller 102 receives the first switch signal and the second switch signal to switch off the first switch circuit 104 and the second switch circuit 105, the off-odor cleaning device 9 is configured to irradiate ultraviolet light on a photocatalyst so as to generate oxygen-containing radicals with strong oxidizing properties to oxidize and decompose an off-odor and bacteria. Therefore, the sterilizing effects of the ultraviolet light and the photocatalyst can be combined so that the off-odor and the bacteria in the cabinet body 1 can be rapidly extinguished. In addition, the off-odor cleaning device 9 of the present disclosure can include both the aforementioned negative ion cleaning device and the photocatalytic ultraviolet cleaning device.

Figure 7:
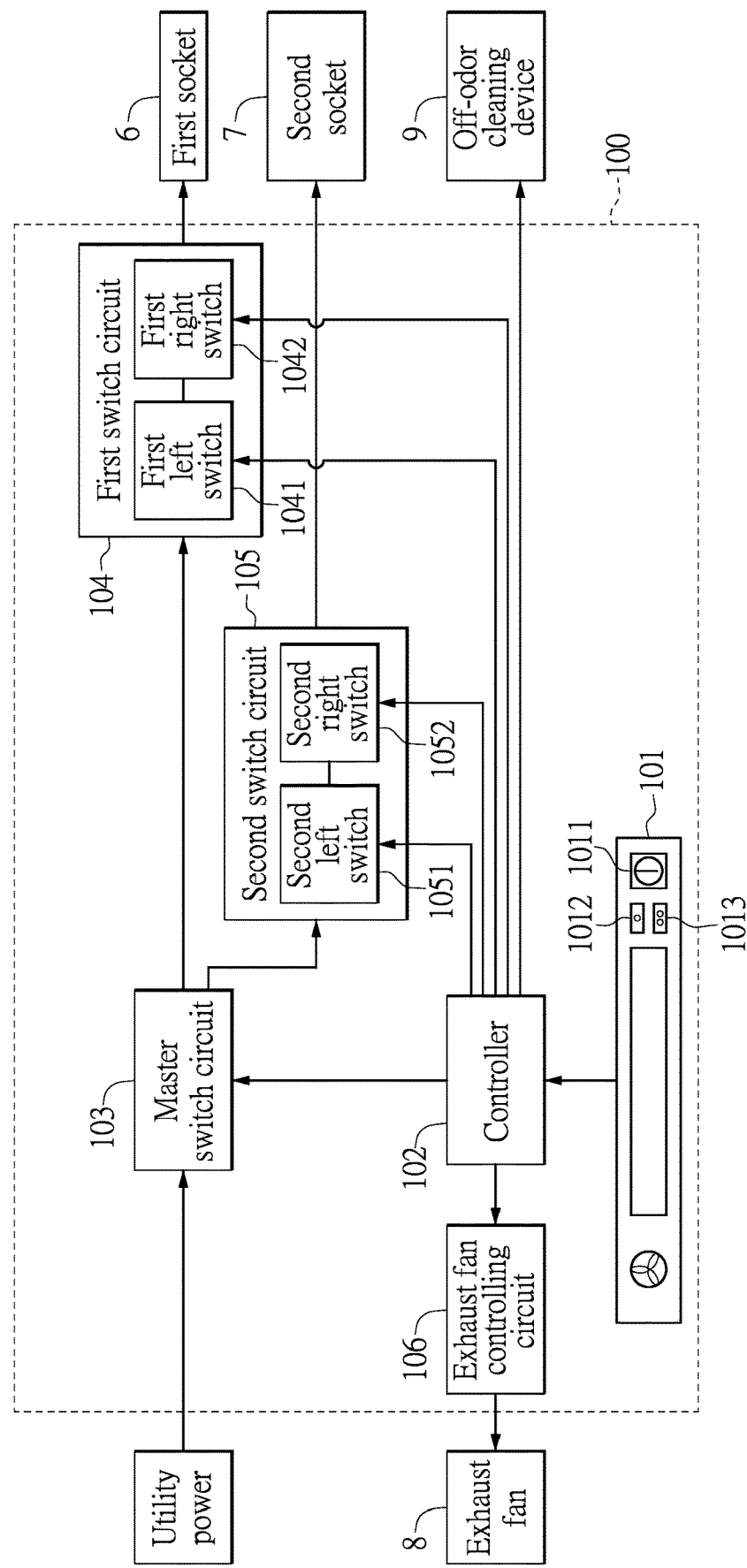
FIG. 7 is yet another schematic functional block diagram of the drawer-type electronics cabinet having the circuit controlling device of the present disclosure.

Reference can be further made to FIG. 7, the first switch circuit 104 includes a first left switch 1041 and a first right switch 1042 that are electrically connected to each other and are electrically connected to the controller 102, respectively, and electric current can be supplied to the first socket 6 only when the first left switch 1041 and the first right switch 1042 are both switched-on.

Furthermore, the second switch circuit 105 includes a second left switch 1051 and a second right switch 1052 that are electrically connected to each other and are electrically connected to the controller 102, respectively, and electric current can be supplied to the second socket 7 only when the second left switch 1051 and the second right switch 1052 are both switched-on.

In this embodiment, the first left switch 1041 and the second left switch 1051 are semiconductor switches, and the first right switch 1042 and the second right switch 1052 are relay switches. Moreover, when the controller 102 switches the first switch circuit 104 or the second switch circuit 105 from being switched-on to being switched-off, the controller 102 switches the first left switch 1041 or the second left switch 1051 to quickly be switched-off, and then switches the first right switch 1042 or the second right switch 1052 to be switched-off. Therefore, when a large electrical current is supplied to the first socket 6 or the second socket 7, spark generation can be prevented when the first right switch 1042 or the second right switch 1052 (relay switches) is switched on and off, thereby improving stability for the overall circuit.

Beneficial Effects of the Embodiment

In conclusion, the drawer-type electronics cabinet 900 provided by the present disclosure includes a cabinet body 1, two sliding rails 2, a carrying tray 3, a door plate 4, and a circuit controlling device 100. The circuit controlling device 100 is disposed in the cabinet body 1. The circuit controlling device 100 includes a controlling interface 101, a controller 102, a master switch circuit 103, a first switch circuit 104, and a second switch circuit 105. The first switch circuit 104 is electrically connected between the master switch circuit 103 and the first socket 6, and the second switch circuit 105 is electrically connected between the master switch circuit 103 and the second socket 7. The controlling interface 101 includes a master switch key 1011, a first switch key 1012, and a second switch key 1013, the master switch key 1011 is used to generate a master switch signal that is transmitted to the controller 102, the first switch key 1012 is used to generate a first switch signal that is transmitted to the controller 102, and the second switch key 1013 is used to generate a second switch signal that is transmitted to the controller 102. The controller 102 is used to enter an operation mode or a standby mode according to the master switch signal that is received by the controller 102. When the controller 102 enters the standby mode, the master switch circuit 103 is switched-off, and when the controller enters the operation mode, the master switch circuit 103 is switched-on. When the controller 102 enters the operation mode, the controller 102 is used to respectively control the first switch circuit 104 and the second switch circuit 105 to be switched-on or switched-off according to the first switch signal and the second switch signal that are received by the controller 102. Therefore, the user does not need to put his hand into the cabinet body 1 that is full of hot air to find the plug and unplug the plug, thereby greatly improving convenience and safety in use, and addressing a long existing issue in the relevant art.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A drawer-type electronics cabinet, comprising:
    a cabinet body, wherein an accommodating space is formed inside the cabinet body, an opening is formed at a front side of the cabinet body, and the opening is in fluid communication with the accommodating space, and wherein a first socket and a second socket are disposed at a rear side of the cabinet body and are accessible from the accommodating space, respectively;
    two sliding rails oppositely disposed in the cabinet body, wherein the two sliding rails are located in the accommodating space and are adjacent to a bottom of the accommodating space;
    a carrying tray, wherein a left side and a right side of the carrying tray are respectively located on the two sliding rails, a front end portion and a rear end portion are respectively defined on a front end and a rear end of the carrying tray that are opposite to each other, and two side walls are respectively formed on the left side and the right side of the carrying tray that are opposite to each other;
    a door plate, wherein an upper end portion and a lower end portion are respectively defined at an upper end and a lower end of the door plate that are opposite to each other, and the lower end portion of the door plate is connected to the front end portion of the carrying tray, so that the carrying tray and the door plate are synchronously moved; and
    a circuit controlling device disposed in the cabinet body, wherein the circuit controlling device includes a controlling interface, a controller, a master switch circuit, a first switch circuit, and a second switch circuit;

wherein the controller is electrically connected to the controlling interface, the master switch circuit, the first switch circuit, and the second switch circuit, the first switch circuit is electrically connected between the master switch circuit and the first socket, and the second switch circuit is electrically connected between the master switch circuit and the second socket; wherein the controlling interface includes a master switch key, a first switch key, and a second switch key, the master switch key is used to generate a master switch signal that is transmitted to the controller, the first switch key is used to generate a first switch signal that is transmitted to the controller, and the second switch key is used to generate a second switch signal that is transmitted to the controller; wherein the controller is used to enter an operation mode or a standby mode according to the master switch signal that is received by the controller; wherein, when the controller enters the standby mode, the master switch circuit is switched-off, and when the controller enters the operation mode, the master switch circuit is switched-on; wherein, when the controller enters the operation mode, the controller is used to respectively control the first switch circuit and the second switch circuit to be switched-on or switched-off according to the first switch signal and the second switch signal that are received by the controller.

2. The drawer-type electronics cabinet according to claim 1, wherein the first switch circuit includes a first left switch and a first right switch that are electrically connected to each other and are electrically connected to the controller, respectively, and the second switch circuit includes a second left switch and a second right switch that are electrically connected to each other and are electrically connected to the controller, respectively; wherein the first left switch and the second left switch are semiconductor switches, and the first right switch and the second right switch are relay switches; wherein, when the controller switches the first switch circuit or the second switch circuit from being switched-on to being switched-off, the controller switches the first left switch or the second left switch to quickly be switched-off, and then switches the first right switch or the second right switch to be switched-off.

3. The drawer-type electronics cabinet according to claim 1, wherein the controller is further used to continuously record a manually switched-off frequency of the first switch circuit and the second switch circuit, so as to automatically switch off the first switch circuit or the second switch circuit according to a higher one of manually switched-off frequencies of the first switch circuit and the second switch circuit.

4. The drawer-type electronics cabinet according to claim 1, wherein the cabinet body includes at least one exhaust fan disposed inside the cabinet body, the circuit controlling device further includes an exhaust fan controlling circuit, and the exhaust fan controlling circuit is electrically connected between the controller and the at least one exhaust fan.

5. The drawer-type electronics cabinet according to claim 1, wherein the cabinet body includes an off-odor cleaning device electrically connected to the controller and the off-odor cleaning device is disposed inside the cabinet body, and wherein the off-odor cleaning device is a negative ion cleaning device configured to ionize air molecules when the first switch circuit and the second switch circuit are switched-off, so as to generate a large amount of negative ions and a trace amount of ozone to neutralize an off-odor and extinguish bacteria.

6. The drawer-type electronics cabinet according to claim 1, wherein the cabinet body includes an off-odor cleaning device that is electrically connected to the controller and disposed inside the cabinet body, and the off-odor cleaning device is a photocatalytic ultraviolet cleaning device configured to irradiate ultraviolet light on a photocatalyst when the first switch circuit and the second switch circuit are switched-off, so as to generate oxygen-containing radicals with strong oxidizing properties to oxidize and decompose an off-odor and bacteria.

7. The drawer-type electronics cabinet according to claim 1, wherein at least one reinforcement member is disposed between the door plate and the carrying tray, and the reinforcement member has a vertical reinforcement sheet and an extension reinforcement sheet that extends from one side of the vertical reinforcement sheet and is bent at ninety degrees; wherein the vertical reinforcement sheet is fixed on a rear surface of the door plate, and the extension reinforcement sheet is adjustably fixed on an inner wall surface of one of the two side walls of the carrying tray; wherein the extension reinforcement sheet has a plurality of long adjustment holes formed thereon, and the plurality of long adjustment holes are arranged in a longitudinal direction of the one side wall of the carrying tray and in a front-and-rear arrangement relative to the door plate, so that the extension reinforcement sheet is adjustably fixed to the inner wall surface of the one side wall of the carrying tray in a front-and-rear arrangement relative to the door plate through the plurality of long adjustment holes and corresponding screws that pass through the plurality of long adjustment holes.

8. The drawer-type electronics cabinet according to claim 7, wherein the plurality of long adjustment holes are horizontal long adjustment holes having a longitudinal direction that is horizontal, and the long adjustment holes is adjustably movable along a longitudinal direction of the one side wall of the carrying tray.

9. The drawer-type electronics cabinet according to claim 8, wherein the extension reinforcement sheet has a connection segment perpendicular to the vertical reinforcement sheet and a horizontal extension segment that extends horizontally from the connection segment along the longitudinal direction of the one side wall of the carrying tray.

* * * * *